(12) United States Patent
Abe et al.

(10) Patent No.: US 8,821,636 B2
(45) Date of Patent: Sep. 2, 2014

(54) SINGLE-CRYSTAL MANUFACTURING APPARATUS

(75) Inventors: Takao Abe, Annaka (JP); Kouzou Yokota, Annaka (JP); Kouji Mizuishi, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 176 days.

(21) Appl. No.: 12/936,450

(22) PCT Filed: Apr. 24, 2009

(86) PCT No.: PCT/JP2009/001888
§ 371 (c)(1),
(2), (4) Date: Oct. 5, 2010

(87) PCT Pub. No.: WO2009/141963
PCT Pub. Date: Nov. 26, 2009

(65) Prior Publication Data
US 2011/0030612 A1    Feb. 10, 2011

(30) Foreign Application Priority Data

May 20, 2008 (JP) ................................. 2008-131637

(51) Int. Cl.
*C30B 15/02* (2006.01)
*C30B 15/14* (2006.01)
*C30B 29/06* (2006.01)
*C30B 15/00* (2006.01)
*C30B 35/00* (2006.01)

(52) U.S. Cl.
CPC ................. *C30B 15/14* (2013.01); *C30B 29/06* (2013.01); *C30B 15/00* (2013.01); *C30B 35/00* (2013.01)
USPC ................. 117/214; 117/13; 117/15; 117/31; 117/35

(58) Field of Classification Search
USPC .................................. 117/13, 15, 31, 35, 214
See application file for complete search history.

(56) References Cited

U.S. PATENT DOCUMENTS

| | | | | |
|---|---|---|---|---|
| 4,410,494 A | * | 10/1983 | Fiegl | 117/214 |
| 6,007,621 A | * | 12/1999 | Yatsurugi | 117/14 |

(Continued)

FOREIGN PATENT DOCUMENTS

| | | |
|---|---|---|
| JP | A-63-319287 | 12/1988 |
| JP | A-09-235173 | 9/1997 |

(Continued)

OTHER PUBLICATIONS

International Preliminary Report on Patentability for International Application No. PCT/JP2009/001888 mailed Jan. 11, 2011, with English-language translation.

(Continued)

*Primary Examiner* — Bob M Kunemund
(74) *Attorney, Agent, or Firm* — Oliff PLC

(57) ABSTRACT

The present invention is a single-crystal manufacturing apparatus based on the Czochralski method having a main chamber configured to accommodate hot zone components including a crucible, and a pull chamber configured to accommodate and take out a single crystal pulled from a raw material melt, the apparatus further comprising a multipurpose chamber interchangeable with the pull chamber, wherein a heating means for heating a raw material charged into the crucible and a cooling means for cooling the hot zone components after pulling the single crystal are placeable in the multipurpose chamber respectively. As a result, there is provided a single-crystal manufacturing apparatus that enables, in manufacture of a single crystal of a large diameter, e.g., approximately 200 mm or more, an operating rate of the single-crystal manufacturing apparatus and productivity of the single crystal to be improved.

20 Claims, 8 Drawing Sheets

(56) References Cited

U.S. PATENT DOCUMENTS

| | | | |
|---|---|---|---|
| 6,569,236 | B1 | 5/2003 | Monden et al. |
| 2001/0008114 | A1* | 7/2001 | Falster et al. ............... 117/3 |
| 2003/0051661 | A1 | 3/2003 | Kubo et al. |

FOREIGN PATENT DOCUMENTS

| | | |
|---|---|---|
| JP | A-10-081595 | 3/1998 |
| JP | A-11-255593 | 9/1999 |
| JP | A-2000-344592 | 12/2000 |
| JP | A-2002-121096 | 4/2002 |
| JP | A-2004-244236 | 9/2004 |

OTHER PUBLICATIONS

International Search Report issued in Application No. PCT/JP2009/001888; Dated Jul. 21, 2009.
Taiwanese Office Action dated Apr. 23, 2013 from Taiwanese Application No. 098114895 (with partial English-language translation).

* cited by examiner

[Figs. 1]
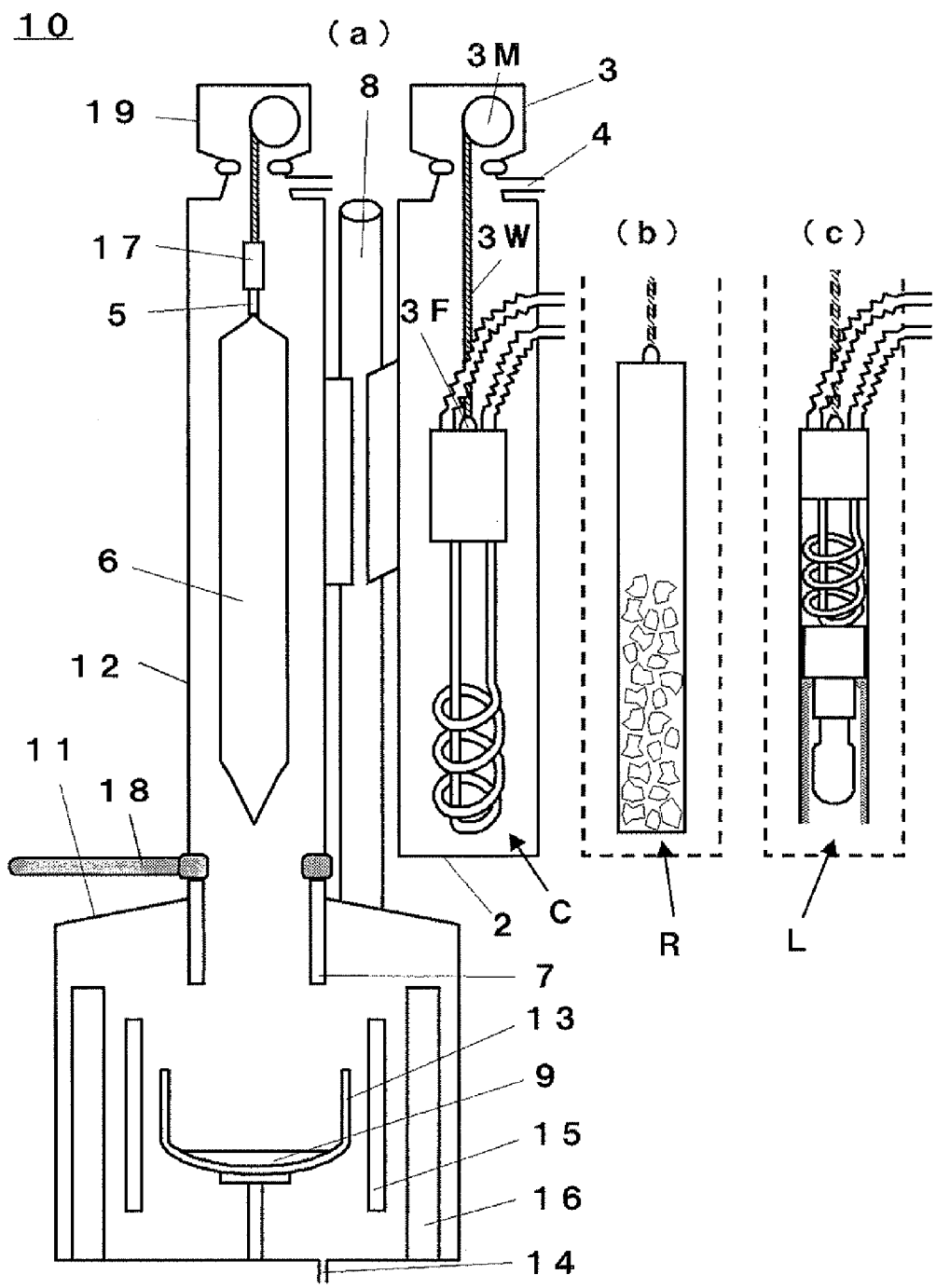

[Fig. 2]
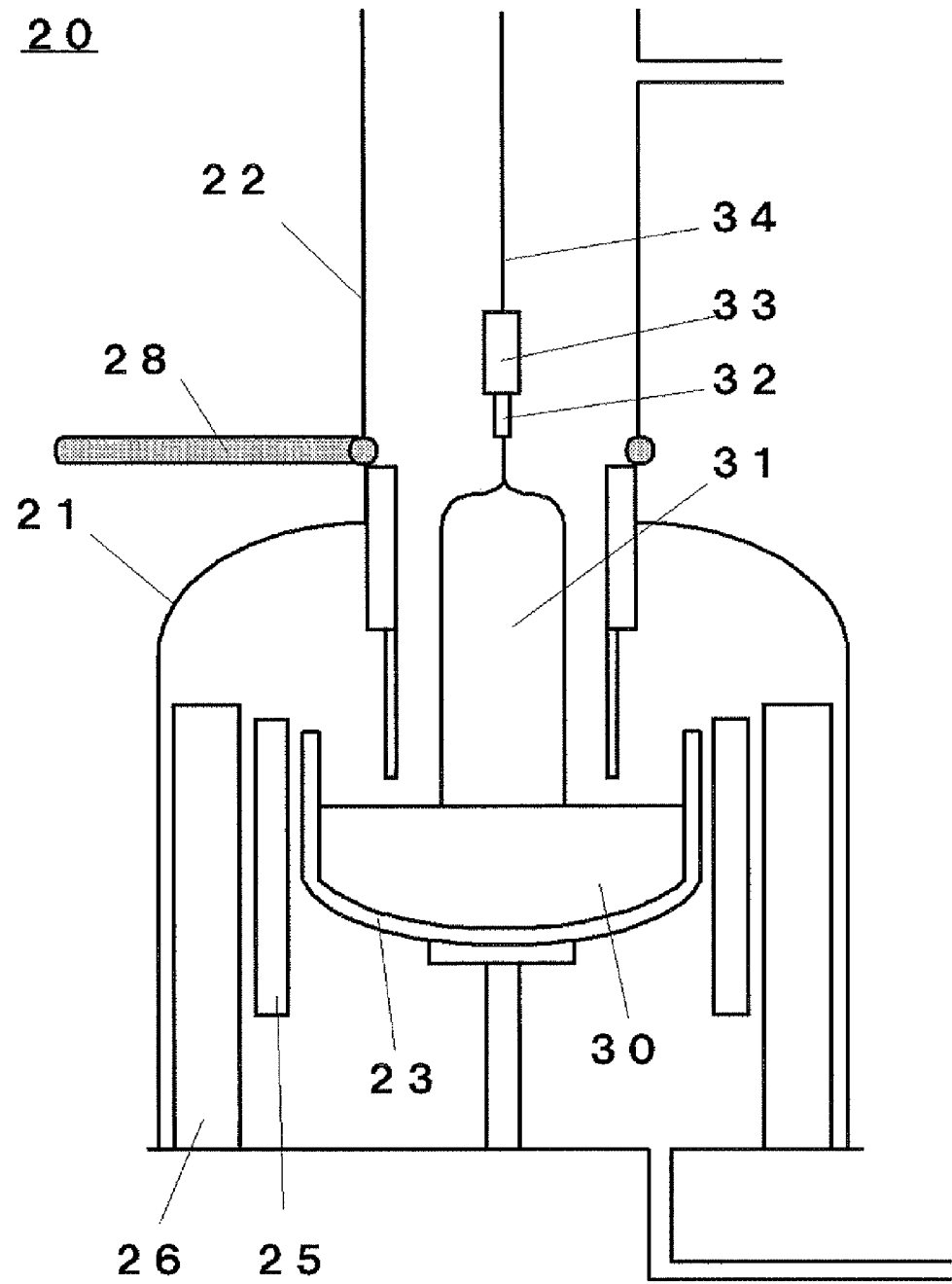

[Fig. 3]

| pull chamber | main chamber | multipurpose chamber | time |
|---|---|---|---|
|  | charging polycrystalline raw material (1) | attaching heating means for polycrystalline raw material (0.5) | 1 |
| attaching charging means for polycrystalline raw material (0.5) | initially melting polycrystalline raw material (3) | | 3 |
|  | additionally charging polycrystalline raw material (1) | | 1 |
| attaching seed crystal (0.5) | additionally melting polycrystalline raw material (3) | | 3 |
| pulling single crystal (50) | | attaching cooling means for hot zone components (0.5) | 50 |
| cooling and taking out single crystal (1) | cooling hot zone components (3) | | 3 |
|  | dismantlement, cleaning and assembling of hot zone components (5) | | 5 |
| total time of manufacture of single crystal: 66 hours | | | |

[Fig. 4]

| pull chamber | main chamber | time |
|---|---|---|
| attaching charging means for polycrystalline raw material (0.5) | charging polycrystalline raw material (1) | 1 |
| initially melting polycrystalline raw material (6) | | 6 |
| additionally charging polycrystalline raw material (1) | | 1 |
| detaching charging means for polycrystalline raw material/ attaching seed crystal (1) | | 1 |
| additionally melting polycrystalline raw material (6) | | 6 |
| pulling single crystal (50) | | 50 |
| cooling and taking out single crystal (1) | | 1 |
| cooling hot zone components (7) | | 7 |
| | dismantlement, cleaning and assembling of hot zone components (5) | 5 |
| total time of manufacture of single crystal: 78 hours | | |

[Figs. 5]
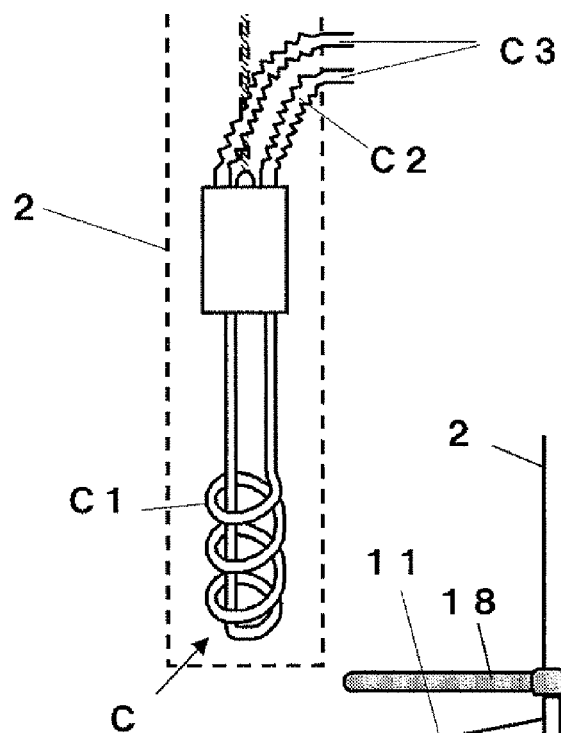
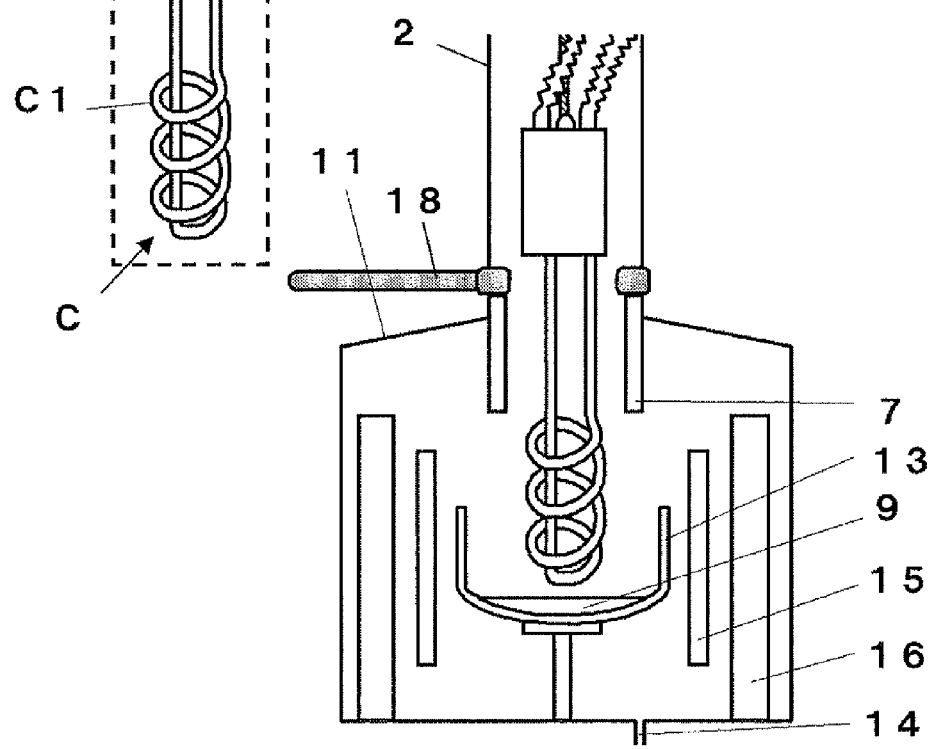

[Figs. 6]
(a)
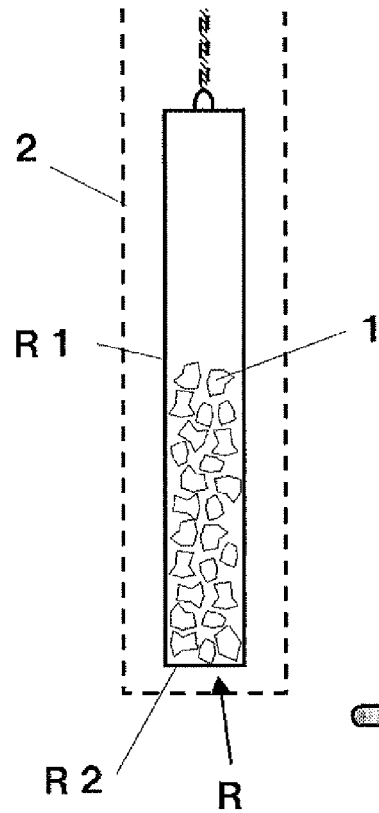
(b)
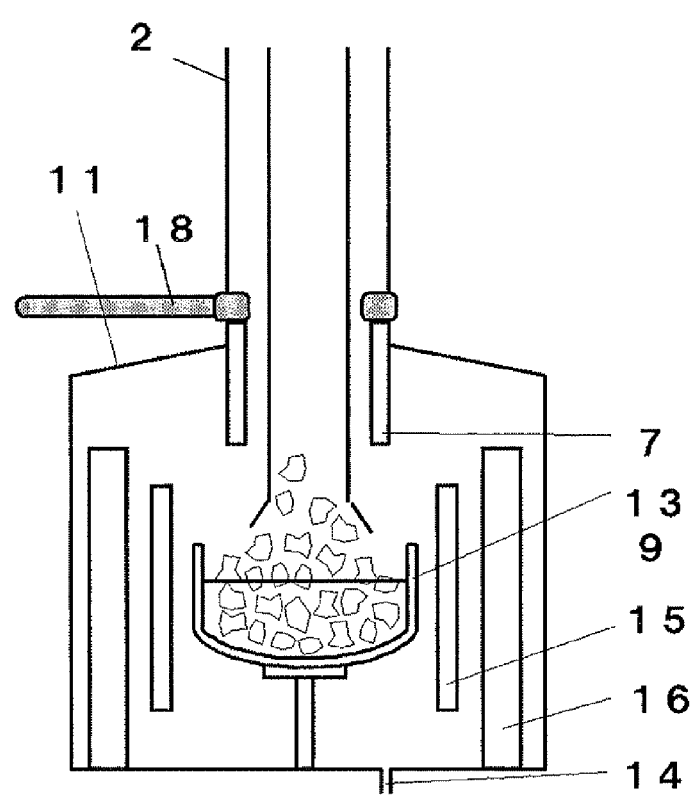

[Figs. 7]
(a)
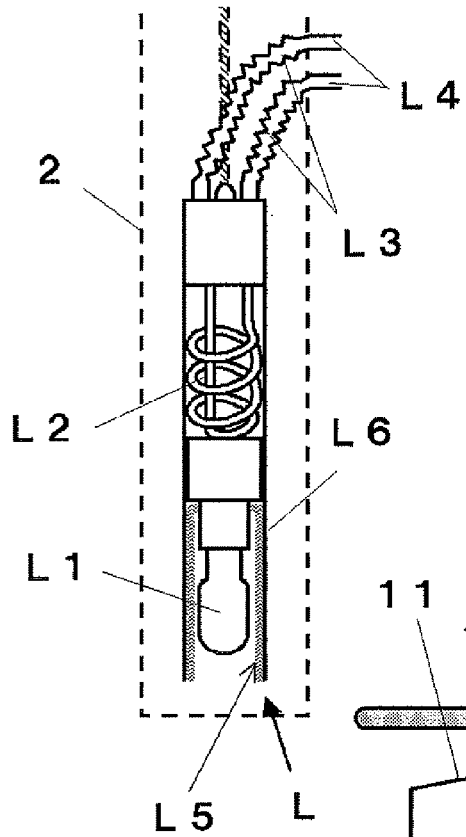
(b)
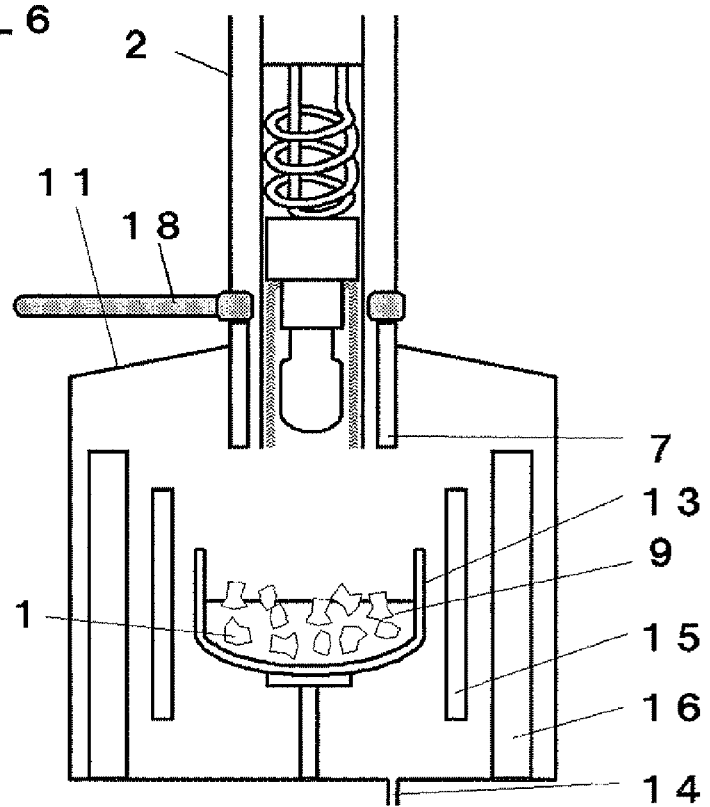

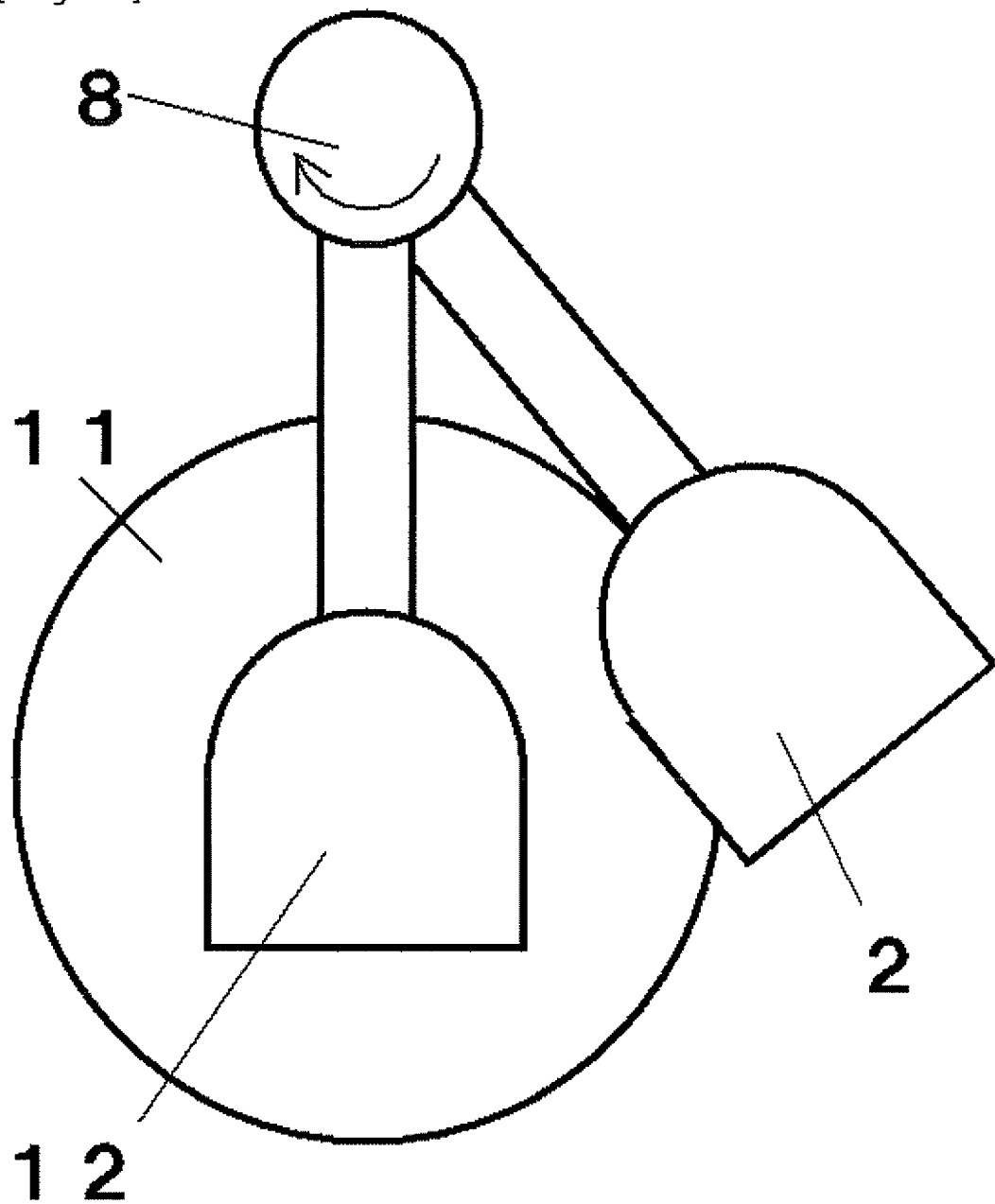
[Fig. 8]

SINGLE-CRYSTAL MANUFACTURING APPARATUS

TECHNICAL FIELD

The present invention relates to a single-crystal manufacturing apparatus for pulling a single crystal by the Czochralski method (hereinafter, also referred to as the CZ method).

BACKGROUND ART

In recent years, to improve performance and reduce a manufacturing cost of a semiconductor device such as a solar cell or an MOS (Metal Oxide Semiconductor) transistor, an increase in diameter of a wafer formed of, e.g., silicon that is used as a substrate has advanced. Therefore, a single-crystal ingot which is grown by, e.g., the CZ method and has a diameter of 200 mm (8 inches), a diameter of 300 mm (12 inches), or more is manufactured, and an increase in diameter and an increase in weight advance.

Such a single-crystal ingot is manufactured by, e.g., a single-crystal manufacturing apparatus depicted in FIG. 2. FIG. 2 is a schematic view showing a general single-crystal manufacturing apparatus used in the CZ method.

This general single-crystal manufacturing apparatus 20 is an apparatus for growing a single crystal 31 from a raw material melt 30 based on the CZ method, and it is configured to accommodate in a main chamber 21 a crucible 23 that contains the raw material melt 30 obtained by melting a polycrystalline raw material, a heater 25 provided around the crucible 23, and a heat insulating material 26 provided around the heater 25.

In particular, components like the crucible 23, the heater 25 and the heat insulating material 26 that are heated are called hot zone components.

A pull chamber 22 configured to accommodate and take out the pulled single crystal 31 is connected to an upper end of the main chamber 21. Further, a gate valve 28 that opens/closes an opening portion at the upper end of the main chamber 21 is provided between the upper end portion of the main chamber 21 and the pull chamber 22. Furthermore, a single-crystal pulling mechanism (not shown) configured to wind up a wire 34 having a seed holder 33 attached at an end thereof is provided above the pull chamber 22.

To manufacture the single crystal 31 by using such a single-crystal manufacturing apparatus 20, a seed crystal 32 is held at an end of the seed holder 33, and the seed crystal 32 is immersed in the raw material melt 30 and gently pulled upwardly while rotating, thereby growing the rod-like single crystal 31.

At this time, an inert gas such as Ar is circulated in the chamber while performing vacuum evacuation to discharge an oxide vaporized from a melt surface.

When pulling the single crystal is finished, the heater is turned off, the gate valve is closed, and the single crystal accommodated in the pull chamber is cooled and taken out. Further, after the hot zone components are cooled down, a pressure in the chamber is restored to a normal pressure, and then the hot zone components in the main chamber are dismantled. When the dismantlement of the hot zone components is finished, cleaning, replacement and others are carried out, then the hot zone components are again assembled, charging the raw material, assembling the chambers, and melting a polycrystalline raw material are carried out, and a single crystal is again pulled up.

In such manufacture of the single crystal based on the CZ method, to achieve an improvement in productivity and a reduction in cost, an increase in a single-crystal growth rate is regarded as one large means to make many improvements in conventional examples. For example, in Japanese Patent Laid-open (Kokai) No.2000-344592 and Japanese Patent Laid-open (Kokai) No.2002-121096, there is a suggestion of placing a cooling body or a cooling pipe so as to surround the vicinity of the single crystal and cooling high temperature parts of the single crystal during the step of pulling the single crystal in order to increase the single crystal growth rate.

However, an operation cycle of manufacture of the single crystal based on the CZ method includes the step of pulling the single crystal and the above many steps other than the pulling, and further greatly reducing a pulling time is difficult under existing circumstances. Therefore, it is considered that reducing a process time for the steps other than the pulling of the single crystal is effective for improving operation efficiency, i.e., for improving an operating rate of the single-crystal manufacturing apparatus to raise productivity.

Except for the single crystal pulling step, proportions of a charging and melting time of the polycrystalline raw material before pulling the single crystal and a cooling time of the hot zone components are high.

The cooling time of the hot zone components is determined based on a condition that carbon members such as the heater are cooled down so that they are not degraded even though they are in contact with oxygen in air when restoring the pressure in the main chamber to a normal pressure. Even in case of manufacture of a single crystal having a diameter of 200 mm (8 inches) and a straight body length of 1 m which is the current mainstream, this cooling time reaches approximately 7 hours in natural cooling, and it takes a little less than a half of the process time of the steps other than the pulling.

Moreover, the charging and melting time of the polycrystalline raw material required for such manufacture of the single crystal reaches approximately 14 hours.

The melting of the polycrystalline raw material and cooling of the hot zone components are precisely an idle period of the single-crystal manufacturing apparatus. Therefore, the process time of the steps other than the pulling of the single crystal eventually becomes a cause of a considerable reduction in the operating rate of the single-crystal manufacturing apparatus. In recent years, a demand for an increase in diameter of the single crystal shows no sign of slowing down, and manufacture of a large single crystal having a diameter of 300 mm (12 inches) or more is often required. In this case, a heat capacity of each hot zone component is more greatly increased beyond a current capacity, and the cooling time is accordingly prolonged. Besides, the melting time is also prolonged in proportion to an increase in a charging amount (a melting amount) of the polycrystalline raw material. Now, a reduction in the operating rate of the apparatus due to the prolongation of the cooling time, the melting time and the like becomes a more serious problem.

In view of this, in order to reduce the melting time of the polycrystalline raw material, there is a suggestion of arranging an auxiliary heating device with a lamp or a laser separately from the heater placed around the crucible in Japanese Patent Laid-open (Kokai) No.H10-81595. In Japanese Patent Laid-open (Kokai) No.H11-255593, there is a suggestion of placing, above the main chamber, an auxiliary heating chamber having an infrared lamp located at a focal position of a reflecting plate of a paraboloidal surface.

In order to reduce the cooling time of the hot zone components, there is a suggestion of circulating an inert gas at room temperature or less into the main chamber in Japanese Patent Laid-open (Kokai) No.H9-235173.

However, in spite of an attempt to reduce the time of each step other than the pulling, a total time for manufacture of one single crystal substantially becomes longer due to the increase in size of the single crystal to be manufactured, and a drastic review has been required with regard to an operation of the single-crystal manufacturing apparatus.

DISCLOSURE OF INVENTION

The present invention was accomplished in view of the above-explained problems, and its object is to provide a single-crystal manufacturing apparatus that enables, in manufacture of a single crystal of a large diameter, e.g., approximately 200 mm or more, the operating rate of the single-crystal manufacturing apparatus and the productivity of the single crystal to be improved.

To solve the foregoing problems, the present invention provides a single-crystal manufacturing apparatus based on the Czochralski method having at least a main chamber configured to accommodate hot zone components including a crucible, and a pull chamber configured to accommodate and take out a single crystal pulled from a raw material melt contained in the crucible, the apparatus further comprising a multipurpose chamber interchangeable with the pull chamber, wherein a heating means for heating a raw material charged into the crucible and a cooling means for cooling the hot zone components after pulling the single crystal are placeable in the multipurpose chamber respectively.

In this manner, the single-crystal manufacturing apparatus according to the present invention comprises the multipurpose chamber in which the heating means for heating the polycrystalline raw material and the cooling means for cooling the hot zone components such as the crucible after pulling the single crystal are placeable, separately from the pull chamber configured to accommodate the single crystal, and the multipurpose chamber and the pull chamber are interchangeable with one another above the main chamber.

This enables the pull chamber and the multipurpose chamber to be simultaneously used, and consequently forced cooling of the hot zone components in the main chamber can be started without waiting to cool and to take out the single crystal from the pull chamber, for example, by placing the cooling means for the hot zone components in the multipurpose chamber during the pulling of the single crystal and by interchanging the pull chamber with the multipurpose chamber just after the end of the pulling of the single crystal. In parallel with this forced cooling of the hot zone components in the main chamber, the single crystal can be cooled in the pull chamber detached from the main chamber and taken out therefrom.

Thus, with the single-crystal manufacturing apparatus according to the present invention provided with the multipurpose chamber interchangeable with the pull chamber, post-processing of a previous step or preparation of a subsequent step can be carried out while a current step is carried out, and a waiting time between steps is thereby eliminated. As a result, a total time for the manufacture of the single crystal can be greatly reduced, and the operating rate of the single-crystal manufacturing apparatus and the productivity can be improved.

In this case, the multipurpose chamber preferably has a moving mechanism for moving at least one of the heating means and the cooling means upwardly and downwardly above the crucible.

In this manner, when the multipurpose chamber has the moving mechanism for moving at least one of the heating means and the cooling means upwardly and downwardly above the crucible, each means can easily descend from the multipurpose chamber to the main chamber, and thereby a function of each means can be enhanced. In addition, an operation of placing each means to the multipurpose chamber can be simplified.

Moreover, the pull chamber and the multipurpose chamber are preferably interchangeable with one another by a hydraulic unit.

In this manner, when the pull chamber and the multipurpose chamber are interchangeable with one another by the hydraulic unit above the main chamber, the pull chamber and the multipurpose chamber can be interchanged with one another with simple structure.

It is preferable that the heating means has at least a heat source inside a quartz pipe, the quartz pipe has inside a reflecting structure for reflecting heat rays toward the crucible, and the heat source is a halogen lamp.

In this manner, when the heating means has at least a heat source inside a quartz pipe and the quartz pipe has inside a reflecting structure for reflecting heat rays toward the crucible, heat rays of the halogen lamp, which is the heat source and heat rays dissipated from the heater can be blocked and condensed to reflect toward the polycrystalline raw material, and thereby the polycrystalline raw material can be greatly efficiently melted.

Moreover, when the heating means to be placed in the multipurpose chamber, which is provided separately from the heater in the main chamber for heating the raw material charged into the crucible, has the halogen lamp inside the quartz pipe, contamination in the main chamber due to the heating means can be prevented. In addition, deterioration of the heating means itself can be prevented, and thereby the heating means can efficiently heat, so that the melting time of the polycrystalline raw material can be reduced.

The cooling means can be a cooling pipe through which a cooling medium circulates.

In this manner, when the cooling means for cooling the hot zone components is the cooling pipe through which the cooling medium circulates, the hot zone components can be forcibly cooled easily at low cast.

Moreover, the multipurpose chamber preferably has a gas inlet for introducing a cooling gas.

In this manner, when the multipurpose chamber has the gas inlet for introducing the cooling gas, the cooling gas can circulate from the gas inlet during the cooling of the hot zone components, and thereby the cooling time of the hot zone components can be more reduced.

A raw-material charging means for containing a polycrystalline raw material and charging it into the crucible is preferably placeable in the multipurpose chamber.

In the case of continuously pulling a number of the single crystals, that is, in the case of continuously pulling the single crystals without cooling the hot zone components, dismantling the hot zone components and cleaning, the raw-material charging means is placed in the multipurpose chamber during the pulling of the single crystal, and after the end of the pulling of the single crystal, the multipurpose chamber is connected to the main chamber without waiting to cool the single crystal, so that recharge of the raw material can be started at once.

In addition, after the end of charging the polycrystalline raw material into the crucible, the raw-material charging means is detached from the multipurpose chamber, and the heating means for heating the raw material charged into the crucible is placed in the multipurpose chamber to melt the polycrystalline raw material contained in the crucible. At the same time, a seed crystal for growing the single crystal can be attached to the seed holder in the pull chamber that is not connected to the main chamber. Thus, when the multipurpose chamber connected to the main chamber is interchanged with the pull chamber after melting the polycrystalline raw material, the step of the pulling of the single crystal can be started just after melting the raw material without the steps of detaching the raw-material charging means and of attaching the seed crystal in the pull chamber, unlike a conventional apparatus.

The raw-material charging means can be a recharge pipe charged with the polycrystalline raw material.

In this manner, when the raw-material charging means is the recharge pipe charged with the polycrystalline raw material, the polycrystalline raw material can be additionally charged into the crucible easily.

The multipurpose chamber preferably has a moving mechanism for moving the raw-material charging means upwardly and downwardly above the crucible.

In this manner, when the multipurpose chamber has the moving mechanism for moving the raw-material charging means upwardly and downwardly above the crucible, the raw-material charging means can easily descend from the multipurpose chamber to the main chamber, and thereby a function of the raw-material charging means can be more enhanced. In addition, an operation of placing the raw-material charging means to the multipurpose chamber can be simplified.

The single-crystal manufacturing apparatus according to the present invention can eliminate the waiting time of each step, the cooling time of the hot zone components and the melting time of the polycrystalline raw material can be reduced, and the operating rate of the single-crystal manufacturing apparatus and the productivity of the manufacture of the single crystal can be consequently improved.

BRIEF DESCRIPTION OF THE DRAWINGS

FIG. 1 are schematic views showing the single-crystal manufacturing apparatus according to the present invention, in which (a) shows a condition where the cooling means for the hot zone components is placed in the multipurpose chamber, (b) shows a condition where the raw-material charging means is placed in the multipurpose chamber, and (c) shows a condition where the heating means for the raw material is placed in the multipurpose chamber;

FIG. 2 is a schematic view showing a general single-crystal manufacturing apparatus used in the CZ method;

FIG. 3 is a step flow chart in case of using the single-crystal manufacturing apparatus according to the present invention;

FIG. 4 is a step flow chart in case of using a conventional single-crystal manufacturing apparatus;

FIG. 5 are explanatory views in case of placing the cooling means for the hot zone components in the multipurpose chamber, in which (a) shows the view at the time of placing it, and (b) shows the view at the time of using it;

FIG. 6 are explanatory views in case of placing the raw-material charging means in the multipurpose chamber, in which (a) shows the view at the time of placing it , and (b) shows the view at the time of using it;

FIG. 7 are explanatory views in case of placing the heating means for the raw material in the multipurpose chamber, in which (a) shows the view at the time of placing it, and (b) shows the view at the time of using it; and FIG. 8 is a plane view of the single-crystal manufacturing apparatus shown in FIG. 1.

BEST MODE FOR CARRYING OUT THE INVENTION

For example, when a single crystal having a total length of approximately 1 m and a diameter of approximately 300 mm is manufactured at a growth rate of 0.5 mm/min, a pulling time of the single crystal is approximately 35 hours. The manufacture of the single crystal needs to melt the polycrystalline raw material before the single crystal growth, and it takes about 12 hours. After the single crystal growth, there are steps of taking out the single crystal after waiting to cool it, cooling the hot zone components provided in the main chamber, dismantling and cleaning the hot zone components, and charging the raw material for next single crystal growth.

As mentioned above, with an increase in diameter and in weight of the single crystal, an amount of the polycrystalline raw material to be melted and the cooling time of the hot zone components noticeably increase, and various measures have been accordingly taken. However, in spite of an attempt to reduce the time of each step other than the pulling, a total time for the manufacture of one single crystal substantially becomes longer due to the increase in size of the single crystal to be manufactured, and a drastic review has been required with regard to an operation of the single-crystal manufacturing apparatus.

In view of this, the present inventors conceived that the waiting time before starting a next step can be eliminated, and the time of the steps of melting the raw material and cooling the hot zone components can be reduced by innovating the multipurpose chamber interchangeable with the pull chamber into a general single-crystal manufacturing apparatus, and thereby bringing the present invention to completion.

Hereinafter, an embodiment of the present invention will be explained in detail with reference to the drawings, but the present invention is not restricted thereto.

FIG. 1 are schematic views showing the single-crystal manufacturing apparatus according to the present invention.

This single-crystal manufacturing apparatus 10 is used in the Czochralski method and mainly includes the main chamber 11, the pull chamber 12, and the multipurpose chamber 2. A gate valve 18 that serves as a lid is provided at an opening portion of an upper end of the main chamber 11.

The main chamber 11 is configured to accommodate the crucible 13 containing a raw material melt 9 obtained by melting the polycrystalline raw material, the heater 15 that is provided around the crucible 13 to melt the polycrystalline raw material and to maintain the temperature of the raw material melt, and a heat insulating material 16 that is provided around the heater 15 to shield against heat emitted from the heater and protect the main chamber 11, as shown in FIG. 1(a).

In particular, an area having a high temperature due to heat radiation from the heater during the single crystal growth is called a hot zone, a component that becomes a red-hot state in the hot zone is called a hot zone component, and representatives of the hot zone component are, e.g., the crucible 13, the heater 15 and the heat insulating material 16.

The pull chamber 12 is a chamber configured to accommodate and take out the single crystal 6 pulled from the raw material melt contained in the crucible 13.

A single-crystal pulling mechanism 19 including a wire is arranged above this pull chamber 12, and a seed crystal holder 17 for holing the seed crystal 5 is attached to an end of the pulling mechanism 19.

The multipurpose chamber 2 is interchangeable with the pull chamber 12. The heating means L for heating the raw material charged into the crucible (See FIG. 1(c)) and the cooling means C for cooling the hot zone components after the pulling of the single crystal (See FIG. 1(a)) are placeable in the multipurpose chamber 2 respectively, and preferably, the raw-material charging means R for containing the polycrystalline raw material and charging it into the crucible 13 (See FIG. 1(*b*)) is placeable in the multipurpose chamber 2.

The multipurpose chamber 2 preferably has the moving mechanism 3 for moving at least one of the raw-material charging means R, the heating means L and the cooling means C upwardly and downwardly above the crucible 13.

With the moving mechanism 3, each means can easily descend from the multipurpose chamber to the main chamber, and thereby the function of each means can be more enhanced. In addition, the operation of placing each means to the multipurpose chamber can be simplified.

In order to place any one of the above-described three means in the multipurpose chamber 2, for example as shown in FIG. 1(*a*), the moving mechanism 3 can include a wire 3W, a hook 3F at an end of the wire 3W, and a winding shaft 3M for winding up the wire 3W, but it is not restricted thereto.

Moreover, as shown in FIG. 1 and FIG. 8, the pull chamber 12 and the multipurpose chamber 2 are preferably interchangeable with one another by the hydraulic unit 8. FIG. 8 is a plane view of FIG. 1.

The pull chamber and the multipurpose chamber can be interchanged with one another with simple structure by rotating the pull chamber 12 and the multipurpose chamber 2 with the hydraulic unit 8 to interchange them above the main chamber 11 as shown in the drawings. When they are interchanged, the gate valve 18 above the main chamber can be closed before the interchange.

Hereinafter, such three means to be placed in the multipurpose chamber will be explained in detail.

The first means to be placed in the multipurpose chamber 2 is the cooling means C for cooling the hot zone components (See FIG. 5).

FIG. 5(*a*) shows a condition where the cooling means C is placed in the multipurpose chamber 2. FIG. 5(*b*) shows a condition where the cooling means C descends from the multipurpose chamber 2 to cool the hot zone components 13, 15, and 16.

As shown in FIG. 5(*a*) (FIG. 1(*a*)), the cooling means C can be the cooling pipe C1 through which a cooling medium circulates. As a result, the hot zone components can be forcibly cooled easily at low cast.

To circulate the cooling medium through the cooling pipe and to configure the cooling pipe to be movable upwardly and downwardly above the crucible 13, for example, the cooling pipe C1 is connected with a pipe C3 leading from the outside of the multipurpose chamber 2 to the inside thereof via a flexible tube C2, so that the cooling pipe can move upwardly and downwardly.

The hot zone components can be more strongly cooled by a radiative cooling effect of the cooling pipe C1 that has descended up to the inside of the crucible 13 as shown in FIG. 5(*b*), in comparison with a conventional method of cooling the hot zone components such as natural cooling or cooling by a cooling cylinder 7 for the cooling of the single crystal. Even the cooling time of a hot zone component having a high heat capacity after the pulling of the single crystal with a large diameter can be greatly reduced.

The cooling pipe C1 obtained by winding a jointless pipe into a ring-like shape for several turns can be used. As a result, the cooling medium hardly leaks from the cooling pipe C1, and a possibility that the inside of the main chamber is contaminated with the cooling medium is reduced.

Furthermore, the pipe of the cooling pipe C1 is preferably a copper pipe. When a material of the cooling pipe is copper, the cooling pipe has good thermal conductivity, thereby enhancing a heat removal effect, and an atmosphere in the main chamber that comes into contact with the cooling pipe can be quickly cooled.

As mentioned above, when the apparatus comprises the moving mechanism 3 for moving the cooling means upwardly and downwardly above the crucible, the cooling pipe C1 can be easily attached to the multipurpose chamber and detached therefrom at a high position, and the cooling effect on the hot zone components can be greatly enhanced when the cooling means is located at a low position.

It is to be noted that the cooling medium circulated through the cooling pipe is not restricted in particular, and it may be coolant water such as pure water. Additionally, to forcibly cool this cooling medium and further facilitate cooling the hot zone components, a heat exchanger (not shown) is preferably installed in the single-crystal manufacturing apparatus. When the cooling medium can be forcibly cooled through the cooling pipe by the heat exchanger installed in the single-crystal manufacturing apparatus in this manner as described above, the cooling effect can be maintained during the cooling step even though the cooling medium is circulated to repeatedly pass through a hot zone. A total used amount of the coolant water can be therefore reduced, which is advantageous for a cost.

To facilitate the cooling of the hot zone components, as shown in FIG. 1(*a*), the gas inlet 4 for introducing a cooling gas is preferably formed at an upper portion of the multipurpose chamber 2.

In this manner, when the gas inlet 4 is formed at the multipurpose chamber 2 in which the cooling means C is to be placed, a convection cooling effect obtained by the cooling gas introduced from the gas inlet 4 can be expected in addition to the radiation cooling effect on the hot zone components obtained by the cooling pipe C1. Thus, the cooling of the hot zone components can be further accelerated.

It is to be noted that since a gas outlet 14 for discharging the introduced gas is provided at a bottom portion of the main chamber 11, the gas introduced from the multipurpose chamber 2 can be discharged from the gas outlet 14 of the main chamber 11.

Next, the second means placeable in the multipurpose chamber 2 is the raw-material charging means R for containing the polycrystalline raw material and charging it into the crucible (See FIG. 6).

FIG. 6(*a*) shows a condition where the raw-material charging means R is placed in the multipurpose chamber 2. FIG. 6(*b*) shows a condition where the raw-material charging means R descends from the multipurpose chamber 2 to charge the polycrystalline raw material 1 into the crucible 13.

As shown in FIG. 6(*a*), the raw-material charging means R can be the recharge pipe R1 charged with the polycrystalline raw material 1. As a result, the polycrystalline raw material can be easily charged into the crucible.

The recharge pipe R1 is provided with a openable/closable lid R2 at its bottom surface to charge the polycrystalline raw material 1 into the crucible 13. In case of manufacturing a silicon single crystal, a possibility of contamination due to impurities for the single crystal can be reduced by making at least an uppermost surface layer of the recharge pipe R1, which is to come into contact with the polycrystalline raw material, of quartz.

Also in this case, when the raw-material charging means R is movable upwardly and downwardly above the crucible by the moving mechanism 3, the recharge pipe R1 can be easily attached to the multipurpose chamber and detached therefrom at a high position, and the raw material can be safely and surely charged into the crucible by opening/closing the lid R2 at a low position.

Finally, the third means to be placed in the multipurpose chamber 2 is the heating means L for heating the raw material charged into the crucible (See FIG. 7).

FIG. 7(a) shows a condition where the heating means L for the raw material, which is placed separately from the heater, is placed in the multipurpose chamber 2. FIG. 7(b) shows a condition where the heating means L heats the polycrystalline raw material 1 after descending from the multipurpose chamber 2.

As shown in FIG. 7(a), the heating means L can have the halogen lamp L1, as a heat source, inside the quartz pipe L6. In this manner, when the heating means for heating the raw material charged into the crucible has the halogen lamp inside the quartz pipe, the heating means which is placed in the multipurpose chamber separately from the heater placed in the main chamber, contamination in the main chamber due to the heating means L can be prevented, the polycrystalline raw material can be efficiently heated by heat from the halogen lamp L1 without deteriorating the halogen lamp L1, and thereby the melting time can be reduced.

In this case, as shown in FIG. 7(a), the cooling pipe L2 for heat removal may be provided inside the quartz pipe L6 to prevent the inside of the multipurpose chamber 2 from being full with the heat from the halogen lamp L1. In this case, with the similar structure to the cooling means for the hot zone components, for example, coolant water and the like can be circulated from a pipe L4, which is connected to the inside and the outside of the multipurpose chamber 2, to the cooling pipe L2 through a stretchable tube L3 so that the heating means L can move upwardly and downwardly above the crucible 13.

In this manner, when the heating means has the cooling pipe, the inside of the multipurpose chamber 2 can be prevented from being damaged due to excessive heat, and the heat resistance of the quartz pipe L6 can be improved. The heating means L can be consequently used for a long time, and a cost can be reduced. In addition, the heat resistance of the heating means L can be further improved by circulating the gas introduced into the multipurpose chamber 2 through the inside of the heating means L.

Moreover, to efficiently conduct the heat emitted from the halogen lamp L1 to the polycrystalline raw material, a reflecting structure for reflecting heat rays toward the polycrystalline raw material 1 in the crucible 13 is formed at the inside L5 of the cylindrical quartz pipe L6.

When such structure is formed, the heat rays from the halogen lamp and the heater, dissipated toward the direction of the chamber connected to the upper portion of the main chamber can be blocked and condensed to reflect toward the polycrystalline raw material 1 with the quartz pipe, so that heat can be effectively used. Heat quantity to the polycrystalline raw material can be therefore increased in comparison with a conventional apparatus, the melting time can be reduced, the productivity can be improved, and the production cost can be reduced.

In detailed explanation of the reflecting structure, as shown in FIG. 7(a), the quartz pipe in which any of gold plating, gold evaporation and gold coating are performed on its upper portion and its side face, or the quartz pipe coated with quartz obtained by burning a slurry or opaque quartz containing bubbles and having a light transmission rate of 10% or less, particularly preferably 1% or less (OM-100 or HRC made by Heraeus) can be adopted as the reflecting structure. As a result, reflection efficiency of the heat rays from the heater can be enhanced, and the melting time of the polycrystalline raw material can be further reduced.

This reflection efficiency is 0.85 in case of gold plating, it is sufficiently higher than that of a graphite material and a quartz material, and the melting time can be therefore reduced.

Next, a method of manufacturing one single crystal by using the single-crystal manufacturing apparatus 10 as described above will be explained with reference to the drawings. Here, FIG. 3 is a step flow chart in case of using the single-crystal manufacturing apparatus 10 according to the present invention. It is to be noted that figures in parentheses in FIG. 3 show a time required for each step.

First, approximately 60% of the required polycrystalline raw material is charged into the empty crucible 13 located in the main chamber 11. The charging only approximately 60% of the polycrystalline raw material is resulted from being impossible to charge more than that into the crucible 13 since the polycrystalline raw material before melting has large volume. Accordingly, the remaining polycrystalline raw material of 40% is additionally charged with the raw-material charging means R after an initial melting.

As shown in FIG. 7(a), the heating means L is attached to the multipurpose chamber 2 during the period of the charging of the polycrystalline raw material.

Next, as shown in FIG. 7(b), the multipurpose chamber 2 in which the heating means L is placed is connected to the main chamber 11. The heating means L is caused to descend to a position shown in FIG. 7(b) with the moving mechanism, and the polycrystalline raw material 1 is heated with the heating means L and the heater 15 to melt (the initial melting of the polycrystalline raw material).

During this period, the polycrystalline raw material to be additionally charged is contained in the recharge pipe R1, and the raw-material charging means R is placed in the pull chamber 12 as shown in FIG. 6(a).

After the end of the initial melting of the polycrystalline raw material, the gate valve 18 of the main chamber is closed, and the multipurpose chamber 2 in which the heating means L is placed is interchanged with the pull chamber 12 in which the raw-material charging means R is placed by the hydraulic unit 8 as shown in FIG. 1(a). Then the gate valve 18 is opened to connect the pull chamber 12 to the main chamber 11. Thereafter, the raw-material charging means R is caused to descend to an appropriate position above the crucible 13 with the moving mechanism (not shown in FIG. 6), the lid R2 located at a bottom portion of the recharge pipe R1 is opened, and the remaining polycrystalline raw material is additionally charged into the crucible 13.

After additionally charging the polycrystalline raw material, the empty raw-material charging means R is pulled up, the gate valve 18 is closed, the pull chamber 12 is interchanged with the multipurpose chamber 2 in which the heating means L is still placed. Then, the polycrystalline raw material is additionally melted in similar manner to the initial melting of the polycrystalline raw material.

During the period of additionally melting the polycrystalline raw material, the raw-material charging means R is detached and the seed holder 17 is placed in the pull chamber that is not connected to the main chamber 11, and the step of attaching the seed crystal 5 is carried out.

Next, after the additionally charged polycrystalline raw material 1 is completely melted to form the raw material melt 9, the gate valve 18 of the main chamber 11 is closed, and the multipurpose chamber 2 in which the heating means L is placed is interchanged with the pull chamber 12 in which the seed crystal has been already attached. Then, the gate valve 18 is opened to connect the pull chamber 12 to the main chamber 11. Thereafter, the seed crystal 5 is brought into contact with the raw material melt 9, and pulling the single crystal is started.

During the pulling of the single crystal, the heating means L for assisting the heating of the polycrystalline raw material is detached and the cooling means C for cooling the hot zone components is placed as shown in FIG. 5(a), in the multipurpose chamber 2 that is not connected to the main chamber 11. After the end of the pulling of the single crystal, the gate valve 18 of the main chamber is closed, the pull chamber 12 in which the single crystal is accommodated is interchanged with the multipurpose chamber 2 in which the cooling means C is placed, above the main chamber 11 to connect multipurpose chamber 2 to the main chamber 11.

As a result, the time required for cooling the single crystal and taking out it can be eliminated.

Next, as shown in FIG. 5(b), the cooling means C is caused to descend to just above the raw material melt 9 remaining in the crucible 13, the cooling of the hot zone components such as the crucible 13, the heater 15, and the heat insulating material 16 is started. During this period, the single crystal 6 is taken out from the pull chamber after waiting to cool the pulled single crystal 6 in the pull chamber 12 that is detached from the main chamber 11.

After the end of the cooling of the hot zone components with the multipurpose chamber 2, the multipurpose chamber 2 is detached from the main chamber 11, dismantlement, cleaning, assembling and the like of the hot zone components are carried out in the main chamber 11.

Thereafter, the step of initially charging the raw material can be started for next single-crystal manufacture.

As mentioned above, the single-crystal manufacturing apparatus 10 according to the present invention can use the pull chamber and the multipurpose chamber simultaneously. The forced cooling of the hot zone components can be therefore started without waiting to cool the single crystal and to take out it from the pull chamber, by placing the cooling means for the hot zone components in the multipurpose chamber during the pulling of the single crystal and by interchanging the pull chamber with the multipurpose chamber just after the end of the pulling of the single crystal. In parallel with the forced cooling of the hot zone components, the single crystal can be cooled in the pull chamber detached from the main chamber and taken out therefrom.

Moreover, when the polycrystalline-raw-material charging means is placed in the pull chamber during the initial melting of the raw material, additionally charging the remaining polycrystalline raw material can be started just after the initial melting. In addition, since the heating means is still placed in the multipurpose chamber, additionally melting can be started at once by only interchanging the pull chamber with the multipurpose chamber after additionally charging the polycrystalline raw material.

Thus, with the single-crystal manufacturing apparatus according to the present invention provided with the multipurpose chamber interchangeable with the pull chamber, post-processing of a previous step or preparation of a subsequent step can be carried out while a current step is carried out, and the waiting time between steps is thereby eliminated. As a result, the total time for the manufacture of the single crystal can be reduced, and the operating rate of the single-crystal manufacturing apparatus and the productivity can be improved.

Moreover, when the cooling means for the hot zone components is placeable in the multipurpose chamber, the cooling time of the hot zone components can be more reduced in comparison with natural cooling of the hot zone components and cooling by using only the cooling cylinder 7 for cooling the single crystal, or a cooling method of circulating only a cooling gas through the main chamber. However, it is not necessary to use only the cooling means for the hot zone components, placed in the multipurpose chamber, and the cooling cylinder for cooling the single crystal, the method of circulating the cooling gas and the like can be also used together with it. Using these together enables the cooling time of the hot zone components to be greatly reduced and enables the operating rate of the single-crystal manufacturing apparatus to be improved.

When the heating means for heating the raw material charged into the crucible is placeable in the multipurpose chamber, the melting time of the polycrystalline raw material can be reduced by heating the polycrystalline raw material charged into the crucible 13 with not only the heater 15 placed in the main chamber 11 but also the heating means L.

It is to be noted that another heater may be further provided at an upper outside of the main chamber 11 to assist the heating of the polycrystalline raw material.

As described above, the single-crystal manufacturing apparatus according to the present invention enables the melting time of the polycrystalline raw material and the cooling time of the hot zone components except for the pulling time of the single crystal to be greatly reduced. In addition, the apparatus can eliminate the waiting time, e.g., for preparation of these steps and improve the operating rate of the single-crystal manufacturing apparatus. This results in great improvement in the productivity of the single crystal manufacture.

Hereinbefore, the case of the manufacture by pulling one single crystal is explained. However, in the case of continuously pulling a number of the single crystal from one crucible, that is, in the event that after the growth of one single crystal, the raw material is additionally charged up to an original amount of the raw material melt to continuously pull the single crystal, the raw-material charging means is placed in the multipurpose chamber during the pulling of the single crystal. After the end of the pulling of the single crystal, the multipurpose chamber is connected to the main chamber without waiting to cool the single crystal, so that the recharge of the raw material can be started at once.

In addition, after the end of charging the polycrystalline raw material into the crucible, the raw-material charging means is detached from the multipurpose chamber and the heating means for heating the raw material charged into the crucible is placed in the multipurpose chamber to additionally melt the polycrystalline raw material in the crucible. At the same time, the seed crystal for growing the single crystal can be attached to the seed holder in the pull chamber that is not connected to the main chamber. Thus, when the multipurpose chamber connected to the main chamber is interchanged with the pull chamber after melting the polycrystalline raw material, the step of the pulling of the single crystal can be started at once without waiting the step of attaching the seed crystal.

Even in the case of continuously pulling a number of the single crystal, the single-crystal manufacturing apparatus according to the present invention enables the cooling time of the single crystal and the melting time of the polycrystalline raw material to be reduced and therefore is useful for reduction of the total time of the single crystal manufacture, and the productivity can be improved.

Hereinafter, the present invention will be explained in more detail based on Example, but the present invention is not restricted thereto.

EXAMPLE

The single-crystal manufacturing apparatus 10 according to the present invention shown in FIG. 1 was used to measure a total time of one cycle required for manufacturing one silicon single crystal ingot based on a flow chart shown in FIG. 3.

First, the polycrystalline silicon raw material having a weight of 360 kg is required for manufacturing a single crystal having a total length of approximately 1.5 m and a diameter of 300 mm, and among this, the raw material having a weight of 200 kg was charged into an empty crucible in 1 hour. During this period, the heating means for the polycrystalline raw material was placed in the multipurpose chamber in 30 minutes.

Thereafter, the charged polycrystalline raw material was melted with the heating means and the heater in 3 hours. During this period, the raw-material charging means having the recharge pipe was attached to the pull chamber.

Next, the pull chamber was connected to the main chamber. The remaining polycrystalline silicon raw material having a weight of 160 kg was additionally charged. This took 1 hour.

Next, the pull chamber in which the raw-material charging means was placed was interchanged with the multipurpose chamber in which the heating means was placed. The additionally charged polycrystalline silicon was additionally melted with the heating means and the heater.

It took 3 hours until the polycrystalline raw material was completely melted.

During this additional melting, an attaching operation of the seed crystal for pulling the single crystal was carried out in the pull chamber in 30 minutes.

Next, the pull chamber was connected to the main chamber, and the seed crystal was brought into contact with the raw material melt to carry out the step of pulling the single crystal. This pulling of the single crystal was carried out at a pulling rate of 0.5 mm/minute. It took 50 hours until the single crystal was completely accommodated in the pull chamber. During this period, the cooling pipe for cooling the hot zone components was placed in the multipurpose chamber in approximately 30 minutes so as to be able to circulate coolant water.

Next, the gate valve was closed with the single crystal remained in the pull chamber. The pull chamber was interchanged with the multipurpose chamber to connect the multipurpose chamber to the main chamber. Then, the coolant water was circulated through the cooling pipe. The cooling pipe was caused to descend to the inside of the crucible to start cooling the hot zone components. During this period, the single crystal was cooled in the pull chamber.

The hot zone components were able to cool to room temperature in approximately 3 hours. After detaching the multipurpose chamber from the main chamber, dismantlement, cleaning, and assembling of the hot zone components were carried out in 5 hours.

As a result, the total time of one cycle required for manufacturing one single crystal was approximately 66 hours with the single-crystal manufacturing apparatus according to the present invention.

Comparative Example

A conventional single-crystal manufacturing apparatus shown in FIG. 2 was used to measure a total time of one cycle required for manufacturing one silicon single crystal ingot based on a flow chart shown in FIG. 4.

First, the polycrystalline silicon raw material having a weight of 360 kg is required for manufacturing a single crystal having a total length of approximately 1.5 m and a diameter of 300 mm, and among this, the raw material having a weight of 200 kg was charged into an empty crucible in 1 hour. Then, the raw-material charging means having the recharge pipe for containing the polycrystalline silicon raw material of a weight of 160 kg was attached to the pull chamber in 30 minutes.

Next, the polycrystalline raw material charged in the crucible 23 was melted with the heater 25 in 6 hours.

Next, the remaining polycrystalline silicon having a weight of 160 kg, contained in the raw-material charging means was additionally charged into the crucible. This took 1 hour. After raising the raw-material charging means to the inside of the pull chamber 22, the gate valve 28 was closed and the raw-material charging means was detached. An attaching operation of the seed crystal for pulling the single crystal was carried out in 1 hour.

Next, the additionally charged polycrystalline silicon was additionally melted with only the heater in the main chamber. It took 6 hours until the additionally charged polycrystalline raw material was completely melted.

After melting the raw material, the seed crystal was brought into contact with the raw material melt to carry out the step of the pulling of the single crystal. This pulling of the single crystal was carried out at a pulling rate of 0.5 mm/min and it took 50 hours until the single crystal was completely accommodated in the pull chamber as with Example.

Next, the gate valve of the main chamber was closed, and the single crystal accommodated in the pull chamber was taken out after waiting to cool it. This took 1 hour.

The present inventor waited until the temperature of the hot zone components became room temperature in order to clean it in the main chamber.

The hot zone components were cooled to room temperature in approximately 7 hours. Then, dismantlement, cleaning, and assembling of the hot zone components were carried out in 5 hours.

As a result, the total time of one cycle required for manufacturing one single crystal was approximately 78 hours with the conventional single-crystal manufacturing apparatus.

The results of Example and Comparative Example reveal that the single-crystal manufacturing apparatus according to the present invention enables the time for cooling and taking out the single crystal to be omitted and the operating rate of the single-crystal manufacturing apparatus can be improved. The placement of the means for reducing the melting time of the polycrystalline raw material and the cooling time of the hot zone components in the multipurpose chamber enables these time to be easily reduced, a total manufacture time is expected to be reduced by approximately 15%, and the manufacturing cost can be reduced.

It is to be noted that the present invention is not restricted to the foregoing embodiments. The foregoing embodiments are just exemplifications, and any examples that have substantially the same configurations and exercise the same functions and effects as the technical concept described in claims of the present invention are included in the technical concept of the present invention.

The invention claimed is:

1. A single-crystal manufacturing apparatus based on the Czochralski method having at least
    a main chamber configured to accommodate hot zone components including a crucible, and
    a pull chamber configured to accommodate and take out a single crystal pulled from a raw material melt contained in the crucible, the apparatus further comprising a multipurpose chamber interchangeable with the pull chamber, wherein a heating means for heating a raw material charged into the crucible and a cooling means for cooling the hot zone components after pulling the single crystal are interchangeably placed in the multipurpose chamber respectively.

2. The single-crystal manufacturing apparatus according to claim 1, wherein the multipurpose chamber has a moving mechanism for moving at least one of the heating means and the cooling means upwardly and downwardly above the crucible.

3. The single-crystal manufacturing apparatus according to claim 1, wherein the pull chamber and the multipurpose chamber are interchangeable with one another by a hydraulic unit.

4. The single-crystal manufacturing apparatus according to claim 1, wherein the heating means has at least a heat source inside a quartz pipe, and the quartz pipe has inside a reflecting structure for reflecting heat rays toward the crucible.

5. The single-crystal manufacturing apparatus according to claim 2, wherein the heating means has at least a heat source inside a quartz pipe, and the quartz pipe has inside a reflecting structure for reflecting heat rays toward the crucible.

6. The single-crystal manufacturing apparatus according to claim 3, wherein the heating means has at least a heat source inside a quartz pipe, and the quartz pipe has inside a reflecting structure for reflecting heat rays toward the crucible.

7. The single-crystal manufacturing apparatus according to claim 4, wherein the heat source is a halogen lamp.

8. The single-crystal manufacturing apparatus according to claim 1, wherein the cooling means is a cooling pipe through which a cooling medium circulates.

9. The single-crystal manufacturing apparatus according to claim 1, wherein the multipurpose chamber has a gas inlet for introducing a cooling gas.

10. The single-crystal manufacturing apparatus according to claim 1, wherein a raw-material charging means for containing a polycrystalline raw material and charging it into the crucible is interchangeably placed in the multipurpose chamber.

11. The single-crystal manufacturing apparatus according to claim 2, wherein a raw-material charging means for containing a polycrystalline raw material and charging it into the crucible is interchangeably placed in the multipurpose chamber.

12. The single-crystal manufacturing apparatus according to claim 3, wherein a raw-material charging means for containing a polycrystalline raw material and charging it into the crucible is interchangeably placed in the multipurpose chamber.

13. The single-crystal manufacturing apparatus according to claim 4, wherein a raw-material charging means for containing a polycrystalline raw material and charging it into the crucible is interchangeably placed in the multipurpose chamber.

14. The single-crystal manufacturing apparatus according to claim 5, wherein a raw-material charging means for containing a polycrystalline raw material and charging it into the crucible is interchangeably placed in the multipurpose chamber.

15. The single-crystal manufacturing apparatus according to claim 6, wherein a raw-material charging means for containing a polycrystalline raw material and charging it into the crucible is interchangeably placed in the multipurpose chamber.

16. The single-crystal manufacturing apparatus according to claim 7, wherein a raw-material charging means for containing a polycrystalline raw material and charging it into the crucible is interchangeably placed in the multipurpose chamber.

17. The single-crystal manufacturing apparatus according to claim 8, wherein a raw-material charging means for containing a polycrystalline raw material and charging it into the crucible is interchangeably placed in the multipurpose chamber.

18. The single-crystal manufacturing apparatus according to claim 9, wherein a raw-material charging means for containing a polycrystalline raw material and charging it into the crucible is interchangeably placed in the multipurpose chamber.

19. The single-crystal manufacturing apparatus according to claim 10, wherein the raw-material charging means is a recharge pipe charged with the polycrystalline raw material.

20. The single-crystal manufacturing apparatus according to claim 10, wherein the multipurpose chamber has a moving mechanism for moving the raw-material charging means upwardly and downwardly above the crucible.

* * * * *